United States Patent
Gumm

(10) Patent No.: US 7,519,330 B2
(45) Date of Patent: Apr. 14, 2009

(54) SIMULTANEOUS ACLR MEASUREMENT

(75) Inventor: Linley F. Gumm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 722 days.

(21) Appl. No.: 10/796,815

(22) Filed: Mar. 8, 2004

(65) Prior Publication Data

US 2005/0197068 A1    Sep. 8, 2005

(51) Int. Cl.
*H04B 17/00* (2006.01)
(52) U.S. Cl. .................. 455/67.11; 455/63.1; 455/296; 375/346
(58) Field of Classification Search .............. 455/67.11, 455/296, 298, 63.1, 67.13; 375/346, 348, 375/349
See application file for complete search history.

(56) References Cited

U.S. PATENT DOCUMENTS

| | | | |
|---|---|---|---|
| 4,459,698 A | 7/1984 | Yumoto et al. | |
| 6,301,312 B1 | 10/2001 | Limberg | |
| 6,307,896 B1 | 10/2001 | Gumm et al. | |
| 6,356,067 B1 | 3/2002 | Nara | |
| 6,363,126 B1 | 3/2002 | Furukawa et al. | |
| 6,608,523 B1 | 8/2003 | Ly | |
| 7,190,740 B2 | 3/2007 | Chu et al. | |
| 2002/0127986 A1* | 9/2002 | White et al. ............. | 455/194.2 |
| 2004/0204034 A1 | 10/2004 | Hanrahan | |
| 2005/0207512 A1 | 9/2005 | Earls et al. | |

\* cited by examiner

*Primary Examiner*—Quochien B Vuong
(74) *Attorney, Agent, or Firm*—Francis I. Gray

(57) ABSTRACT

A system for simultaneous ACLR measurements encompassing multiple wireless communications channels provides a dual channel processing. The input signal is down converted to produce a wideband signal that is input simultaneously to both a wideband channel having a high speed, low resolution ADC and a narrow band channel having a low speed, high resolution ADC. The resulting data streams from the ADCs are processed by a DSP to provide the simultaneous ACLR measurements.

5 Claims, 1 Drawing Sheet

SIMULTANEOUS ACLR MEASUREMENT

BACKGROUND OF THE INVENTION

The present invention relates to radio frequency (RF) measurements, and more particularly to a dual channel measurement system for simultaneous adjacent channel leakage ratio (ACLR) measurement.

Modern RF measurement equipment typically converts an input RF signal to an intermediate frequency (IF) signal which is then converted into a digital domain by an analog-digital converter (ADC). The intricate signal processing and measurement functions, such as applying a final measurement bandwidth to the signal, demodulation of the signal with subsequent modulation measurement if desired, or perhaps detection and logarithmic compression of the signal to obtain a spectral amplitude display, are then performed in a digital signal processing (DSP) system. The major difficulty of such an approach is with the ADCs. An ADC suitable for very wide dynamic range display of spectral components featuring a large number of output bits of precision may have a limited bandwidth, making demodulation of wideband signals impossible. An ADC suitable for measuring wideband signals featuring a very high conversion rate has a limited number of output bits, making wide dynamic range measurements impossible.

The difficulty of the selection of ADCs is highlighted by the desire of those in the wireless communications industry to make what is known as a simultaneous ACLR measurement, which is the ratio of the power within a transmitter's occupied channel to power leaked by the transmitter into an adjacent channel. When performing simultaneous ACLR measurements five or more wideband wireless signals are present. The term "simultaneous" means that measurements must be made simultaneously of each carrier's power and the resulting adjacent channel leakage signal. The reason for this requirement is that the instantaneous power of each channel varies somewhat, and it is desired to correlate the amplitude of the leakage signal with the variations in individual carrier power. This cannot be done if each signal is measured sequentially.

One approach to this measurement is to use a very high conversion rate ADC with as many bits of precision as possible. This limits the dynamic range of the ACLR measurement below what the wireless communications industry desires, so there is intense pressure to improve measurement performance. Another approach is to use three state of the art ADCs, each measuring a sub-band of the incoming signal. The results are "stitched" together using very complicated DSP techniques involving error correction in each channel, taking a fast Fourier transform (FFT) of each channel, stitching together the spectrum of the three FFTs, and then taking the inverse FFT of the result to achieve the time record of the wide measurement channel. This approach requires three very fast, state-of-the-art ADCs with a large number of bits and a large DSP processor to achieve the wideband result, but still does not achieve quite as much dynamic range as desired.

What is desired is a system for measuring simultaneous ACLR that is more accurate than present techniques.

BRIEF SUMMARY OF THE INVENTION

Accordingly the present invention provides a system for simultaneous ACLR measurements that uses a dual channel measurement architecture. An input signal is down converted to produce a wideband signal that is input simultaneously to both a wideband channel having a high speed, low resolution ADC and a narrow band channel having a low speed, high resolution ADC. The resulting data streams from the ADCs are processed by a DSP to provide the simultaneous ACLR measurements.

The objects, advantages and other novel features are apparent from the following detailed description when read in conjunction with the appended claims and attached drawing.

DETAILED DESCRIPTION OF THE INVENTION

Figure 1:
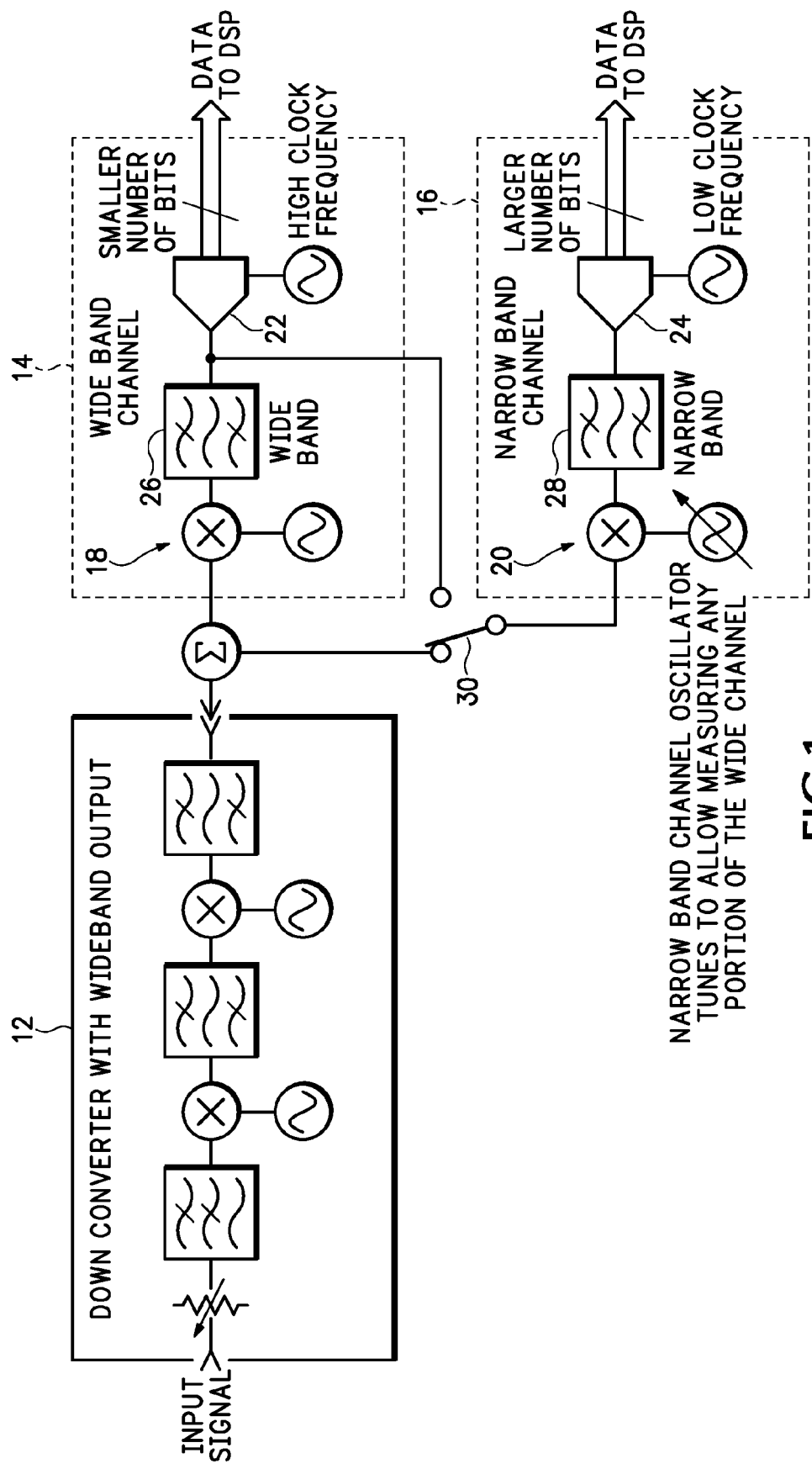
FIG. 1 is a block diagram view of a dual channel measurement system for measuring simultaneous ACLR according to the present invention.

The approach of the present invention allows the use of good, but not state-of-the-art, ADCs to achieve accurate simultaneous ACLR measurement results by dividing the measurement tasks. A wideband, lower dynamic range, channel is used to measure the amplitude of all five or more wideband wireless communications signals, which measurement needs only 40-50 dB of dynamic range since the sole required result is an accurate measurement of each signal's amplitude. A second, narrower, wide dynamic range measurement channel is used to measure the leakage power in an adjacent channel. The two measurements are made simultaneously so that the instantaneous power of individual carriers is correlated with the leakage power. Two available ADCs are used to enable state-of-the-art dynamic range measurements.

Referring now to FIG. 1 a wideband wireless communications signal encompassing multiple wireless channels is input to a common down conversion channel 12 having a wideband output signal. The wideband output signal is input to two channels, a wideband channel 14 and a narrow band channel 16. Each channel 14, 16 has an intermediate frequency (IF) system 18, 20 followed by an ADC 22, 24. The wideband channel 14 is normally centered at a higher frequency and features a much wider band IF filter 26, such as 110 MHz, followed by a high conversion rate ADC 22, such as 400 Msamples/sec, that has a relatively modest number of bits of precision, such as 8-10 bits. The narrow band channel 16 features a much narrower band IF filter 28, such as 1-3 MHz, followed by a slower conversion rate ADC 24, such as 25 Msamples/sec, with a much larger number of bits of precision, such as 14-16. The signal for the narrow band channel 16 may be derived via a switch 30 directly from the output of the down converter 12, or might possibly be obtained from the output of the wide band IF filter 26 depending upon which is more advantageous. A local oscillator 32 for the narrow band IF system 20 is tunable to allow measuring a desired portion of the spectrum of the signal input to the narrow band channel 16.

The used of frequency conversions in the two channels 14, 16 is illustrative. It is quite possible that a very high speed ADC 22 in the wideband channel 14 may not require any frequency conversion between it and the down converter 12. Further it is possible that to obtain sufficient spurious free tuning range, more than one frequency conversion stage 20 may be required in the narrow band channel 16.

The outputs from the ADCs 22, 24 are input to a DSP (not shown) to perform the necessary calculations for simultaneous ACLR measurements, as is known in the art.

Thus the present invention provides a system for simultaneous ACLR measurements of multiple wireless communications channels by using a dual channel system architecture that includes a wideband channel with a high speed, lower resolution ADC and a narrow band channel with lower speed, higher resolution channel, the outputs of the two channels being processed by a DSP to produce the simultaneous ACLR measurements.

What is claimed is:

1. A system for simultaneous adjacent channel leakage ratio (ACLR) measurements comprising:
   a down conversion system for receiving a wideband signal as an input and providing a corresponding wideband signal as an output;
   a wideband channel having the corresponding wideband signal as an input and providing a high speed, low resolution data stream as an output;
   a narrow band channel having the corresponding wideband signal as an input and providing a low speed, high resolution data stream as an output; and
   means for processing the data streams to produce the simultaneous ACLR measurements.

2. The system as recited in claim 1 wherein the narrow band channel comprises:
   a tunable IF frequency converter having the corresponding wideband signal as an input and providing a narrow band signal as an output; and
   a low speed, high resolution analog-digital converter (ADC) having the narrow band signal as an input and providing the low speed, high resolution data stream as an output.

3. The system as recited in claims 1 or 2 wherein the wideband channel comprises:
   an IF frequency converter having the corresponding wideband signal as an input and providing a converted wideband signal as an output; and
   a high speed, low resolution analog-digital converter (ADC) having the converted wideband signal as an input and providing the high speed, low resolution data stream as an output.

4. The system as recited in claim 3 wherein the corresponding wideband signal input to the tunable IF frequency converter comprises the converted wideband signal.

5. The system as recited in claims 1 or 2 wherein the wideband channel comprises a high speed, low resolution analog-digital converter (ADC) having the corresponding wideband signal as an input and providing the high speed, low resolution data stream as an output.

* * * * *